United States Patent
Wilson et al.

(10) Patent No.: US 6,226,394 B1
(45) Date of Patent: *May 1, 2001

(54) NON-LOT BASED METHOD FOR ASSEMBLING INTEGRATED CIRCUIT DEVICES

(75) Inventors: Kevin Wilson; Ron Hjorth, both of Boise, ID (US)

(73) Assignee: Micron Tecnology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/440,736

(22) Filed: Nov. 16, 1999

Related U.S. Application Data (63) Continuation of application No. 09/027,144, filed on Feb. 20, 1998, now Pat. No. 6,049,624.

(51) Int. Cl.$^7$ .............................. G06F 19/00; G06K 7/10
(52) U.S. Cl. ............................ 382/145; 702/187
(58) Field of Search .................... 382/141, 145, 382/146–149, 152; 702/80–84, 185, 187, 118; 348/87, 126; 356/237.4, 237.5; 438/7, 15, 16; 250/559.34, 559.44; 209/577; 235/375; 700/108–110, 96, 115, 116, 121

(56) References Cited

U.S. PATENT DOCUMENTS

| | | | |
|---|---|---|---|
| 4,027,246 | 5/1977 | Caccoma et al. | 235/151 |
| 4,454,413 | 6/1984 | Morton, Jr. | 235/375 |
| 4,510,673 | 4/1985 | Shils et al. | 29/574 |
| 4,958,373 | 9/1990 | Usami et al. | 382/8 |
| 4,967,381 | 10/1990 | Lane et al. | 364/551.01 |
| 4,985,988 | 1/1991 | Littlebury | 29/827 |
| 5,003,251 | 3/1991 | Fuoco | 324/158 F |
| 5,043,657 | 8/1991 | Amazeen et al. | 324/158 R |
| 5,103,166 | 4/1992 | Jeon et al. | 324/158 R |
| 5,118,369 | 6/1992 | Shamir | 156/64 |
| 5,175,774 | 12/1992 | Traux et al. | 382/145 |

(List continued on next page.)

FOREIGN PATENT DOCUMENTS 5-74909    3/1993   (JP) .

OTHER PUBLICATIONS

English translation of abstract of Japanese Patent No. 5-74909.

Fresonke, Dean, In–Fab Identification of Silicon Wafers with Clean, Laser Marked Barcodes, Advanced Semiconductor Manufacturing Conference and Workshop, 1994, IEEE/SEMI, pp. 157–160, Nov. 1994.

* cited by examiner

Primary Examiner—Leo H. Boudreau
Assistant Examiner—Brian P. Werner
(74) Attorney, Agent, or Firm—Trask Britt (57) ABSTRACT

An inventive method tracks IC devices through the assembly steps in a manufacturing process. Prior to die attach, a laser scribe marks the lead frame of each of the devices with a coded hole matrix that gives each device a unique ID code. During die attach, an optical hole reader retrieves the ID code of each of the IC devices, and a computer system stores the retrieved ID codes in association with the lot numbers of the ICs attached to the lead frames. The ID codes of the devices are then read at each step in assembly so the devices can be tracked through assembly individually, rather than by lots. As a result, the devices can proceed through assembly in a more efficient, continuous manner (i.e., without breaks between lots).

33 Claims, 7 Drawing Sheets

U.S. PATENT DOCUMENTS

| | | | |
|---|---|---|---|
| 5,197,650 * | 3/1993 | Monzen et al. | 228/6.2 |
| 5,217,834 | 6/1993 | Higaki | 430/30 |
| 5,226,118 | 7/1993 | Baker et al. | 395/161 |
| 5,271,796 | 12/1993 | Miyashita et al. | 156/626 |
| 5,289,113 | 2/1994 | Meaney et al. | 324/73.1 |
| 5,294,812 | 3/1994 | Hashimoto et al. | 257/65 |
| 5,301,143 | 4/1994 | Ohri et al. | 365/96 |
| 5,347,463 | 9/1994 | Nakamura et al. | 364/478 |
| 5,350,715 | 9/1994 | Lee | 437/250 |
| 5,360,747 | 11/1994 | Larson et al. | 437/8 |
| 5,399,531 | 3/1995 | Wu | 437/205 |
| 5,420,796 | 5/1995 | Weling et al. | 364/468 |
| 5,448,488 | 9/1995 | Oshima | 364/468 |
| 5,467,304 | 11/1995 | Uchida et al. | 365/174 |
| 5,511,005 | 4/1996 | Abbe et al. | 364/552 |
| 5,654,204 | 8/1997 | Anderson | 438/15 |
| 5,787,012 | 7/1998 | Levitt | 364/490 |
| 5,801,067 | 9/1998 | Shaw et al. | 438/15 |
| 5,805,472 | 9/1998 | Fukasawa | 364/579 |
| 5,837,558 | 11/1998 | Zuniga et al. | 438/15 |
| 5,844,803 | 12/1998 | Beffa | 364/468.28 |
| 5,856,923 | 1/1999 | Jones et al. | 364/468.28 |
| 5,890,807 | 4/1999 | Ingel et al. | 382/100 |
| 5,907,492 | 5/1999 | Akram et al. | 364/468.28 |
| 5,915,231 | 6/1999 | Beffa | 702/118 |

NON-LOT BASED METHOD FOR ASSEMBLING INTEGRATED CIRCUIT DEVICES

CROSS-REFERENCE TO RELATED APPLICATIONS

This application is a continuation of application Ser. No. 09/027,144, filed Feb. 20, 1998, now U.S. Pat. No. 6,049,624, issued Apr. 11, 2000.

This application is related to the following co-pending applications: an application entitled "Method for Sorting Integrated Circuit Devices," filed Jan. 17, 1997, and having Ser. No. 08/785,353, now U.S. Pat. No. 5,927,512, issued Jul. 27, 1999; an application entitled "Method of Sorting a Group of Integrated Circuit Devices for Those Devices Requiring Special Testing," filed Feb. 17, 1997, and having Ser. No. 08/801,565, now U.S. Pat. No. 5,844,803, issued Dec. 1, 1998; an application entitled "Method in an Integrated Circuit (IC) Manufacturing Process for Identifying and Redirecting IC's Mis-Processed During their Manufacture," filed Feb. 26, 1997, and having Ser. No. 08/806,442, now U.S. Pat. No. 5,915,231, issued Jun. 22, 1999; an application entitled "Method for Continuous, Non-Lot Based Integrated Circuit Manufacturing," filed Mar. 24, 1997, and having Ser. No. 08/822,731, now U.S. Pat. No. 5,856,923, issued Jan. 5, 1999; and an application entitled "Method for Using Data Regarding Manufacturing Procedures Integrated Circuits (IC's) Have Undergone, Such as Repairs, to Select Procedures the IC's Will Undergo, Such as Additional Repairs," filed Jun. 6, 1997, and having Ser. No. 08/871,015, now U.S. Pat. No. 5,907,492, issued May 25, 1999.

BACKGROUND OF THE INVENTION

1. Field of the Invention

This invention relates in general to methods for manufacturing integrated circuit (IC) devices. More specifically, the invention relates to non-lot based IC device manufacturing methods in which individual devices can be uniquely identified during their assembly, which enables individual tracking of the devices through assembly and, in turn, enables assembly of the devices in a substantially continuous manner.

2. State of the Art

Figure 1:
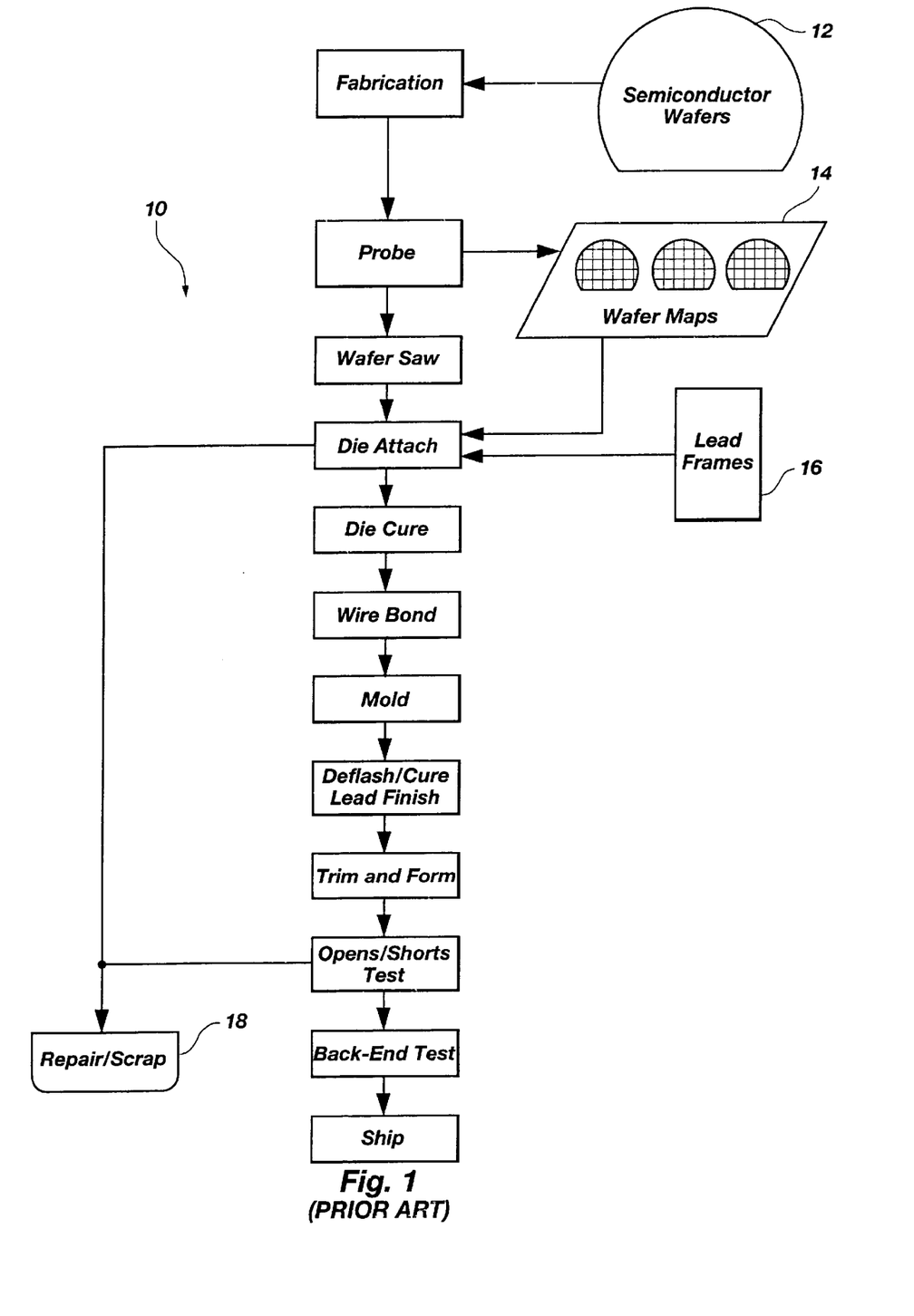
FIG. 1 is a flow diagram illustrating a conventional lot-based integrated circuit (IC) manufacturing process.

As shown in FIG. 1, a process 10 for manufacturing integrated circuit (IC) devices typically begins with ICs being fabricated on the surfaces of wafers 12 of semiconductor material, such as silicon. Less typically, ICs may also be formed in layers of silicon deposited on layers of sapphire known as Silicon-on-Sapphire (SOS), Silicon-on-Insulator (SOI), or Silicon-on-Glass (SOG).

Once fabricated, ICs are electronically probed to determine whether they are functional (i.e., "good") or nonfunctional (i.e., "bad"). A computer then stores electronic wafer maps 14 of the wafers 12 identifying the locations of the good and bad ICs on the wafers 12.

After being probed, ICs are sawed from their wafers 12 into discrete IC dice (also known as "chips") using high-speed precision dicing equipment. IC dice identified as good by their wafer maps 14 are then each "picked" by automated equipment from their sawed wafers 12 and "placed" on an epoxy coated bonding site of one of a set of lead frames 16, while IC dice identified as bad are discarded into a scrap bin 18. The epoxy attaching the good IC dice to their lead frames 16 is allowed to cure, and the attached dice are then wire bonded to their lead frames 16 using high speed bonding equipment. At this point in the process 10, the lead frames 16 of IC dice are still interconnected.

Once wire bonded, IC dice and their lead frames 16 are formed into IC packages using a hot thermosetting plastic encapsulant injected into a mold. Leads of the lead frames 16 project from the IC packages after encapsulation, and these leads are dipped in a cleansing chemical bath in a process referred to as "de-flash." After de-flash, IC packages are cured to set their plastic encapsulant, and their projecting leads are then electroplated with a lead/tin finish.

After lead finishing, connections between the lead frames 16 of different IC packages are cut to "singulate" the IC packages into discrete IC devices, and the leads projecting from each IC device are then trimmed and formed into their final form. The IC devices are then tested in a simple electronic test that checks for "opens" (i.e., no connection) in the devices where connections should exist and "shorts" (i.e., a connection) where connections should not exist. Devices that fail the opens/shorts test are discarded into the scrap bin 18, and devices that pass proceed to extensive back-end test procedures where they are tested for functionality before being shipped to customers.

ICs are typically tracked by lot number through the fabrication, probe, assembly, and back-end test steps described above so the location of particular lots of ICs within the manufacturing process 10 can be determined. Lot numbers are first assigned to ICs when they are fabricated on semiconductor wafers 12. Typically, a group of 20–50 wafers 12 receives a unique lot number (e.g., 36/1/9970). As the group of wafers 12 proceeds to probe, the wafers 12 are typically split into several sub-lots, with each sub-lot being assigned a new lot number (sometimes referred to as a "sublot" number) that is a modified form of the group's original lot number (e.g., 36/1/9970/0, 36/1/9970/1, . . .). As the group continues through the manufacturing process 10, sub-lots are split and resplit for a variety of reasons until the group is typically split into many sub-lots, all having a unique lot number that is a modified form of the group's original lot number.

Figure 2:
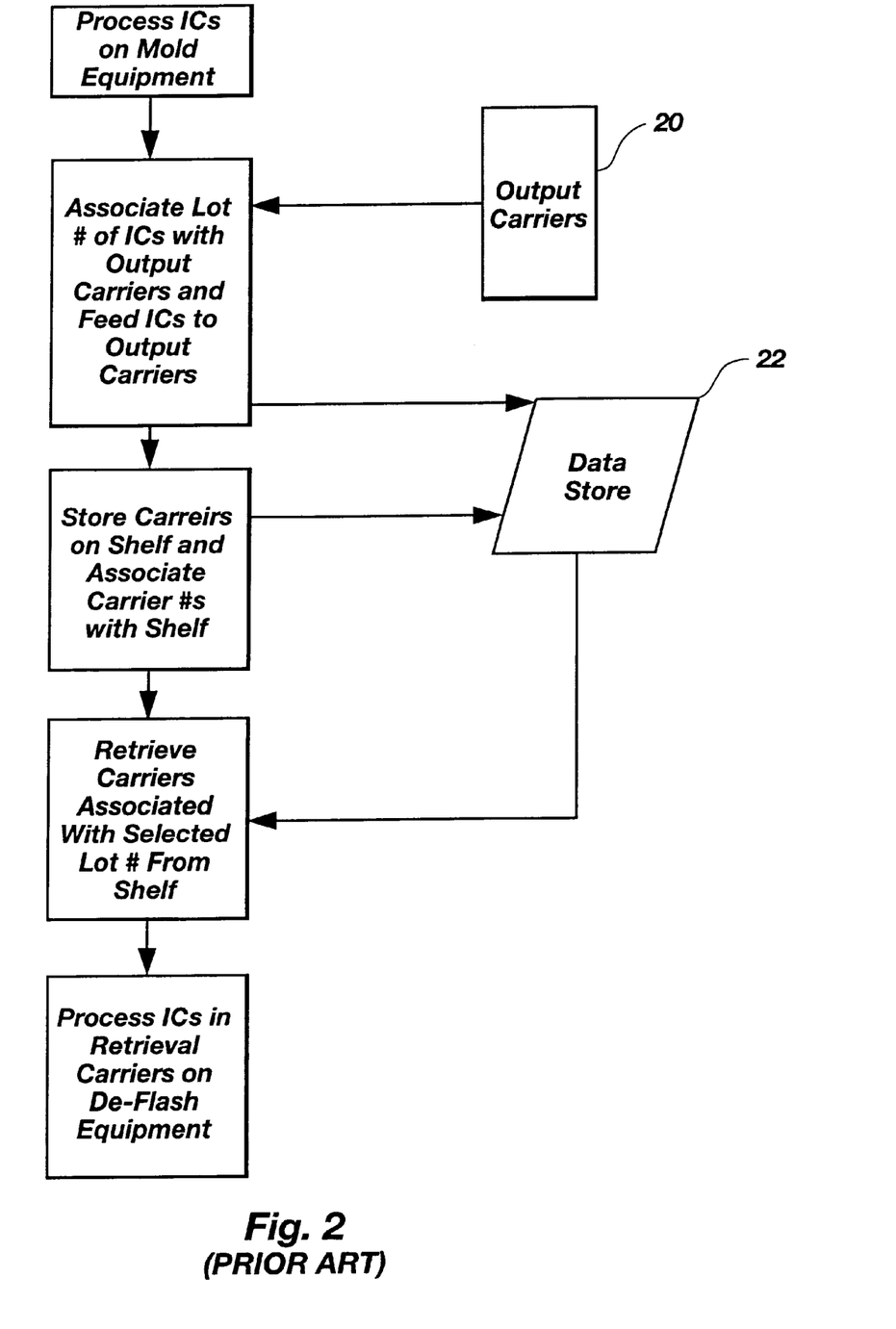
FIG. 2 is a flow diagram illustrating a portion of the conventional lot-based process of FIG. 1 in more detail.

An example of ICs being tracked through a portion of assembly using lot numbers is shown in FIG. 2. In the example, ICs are first processed on molding equipment to encapsulate them. Once encapsulated, ICs are fed into output carriers 20, each of which has a unique carrier number (e.g, a bar code). The lot numbers of ICs fed into a particular output carrier 20 are stored in association with the carrier number of the carrier 20 in a data store 22, such as a computer memory system. The output carriers 20 containing the encapsulated ICs are then placed on shelves, with the carrier number of each output carrier 20 being stored in the data store 22 in association with a unique shelf number of the shelf on which the output carrier 20 is placed (e.g., by scanning in the bar code of each output carrier 20 and a bar code of the shelf on which it is placed). Later, selected ICs are retrieved by lot from the shelves for processing on de-flash equipment by first identifying the output carriers 20 associated in the data store 22 with the lot number of the selected ICs, then identifying the shelves associated in the data store 22 with the carrier numbers of the identified output carriers 20, and finally retrieving the identified output carriers 20 from the identified shelves for processing.

Figure 3:
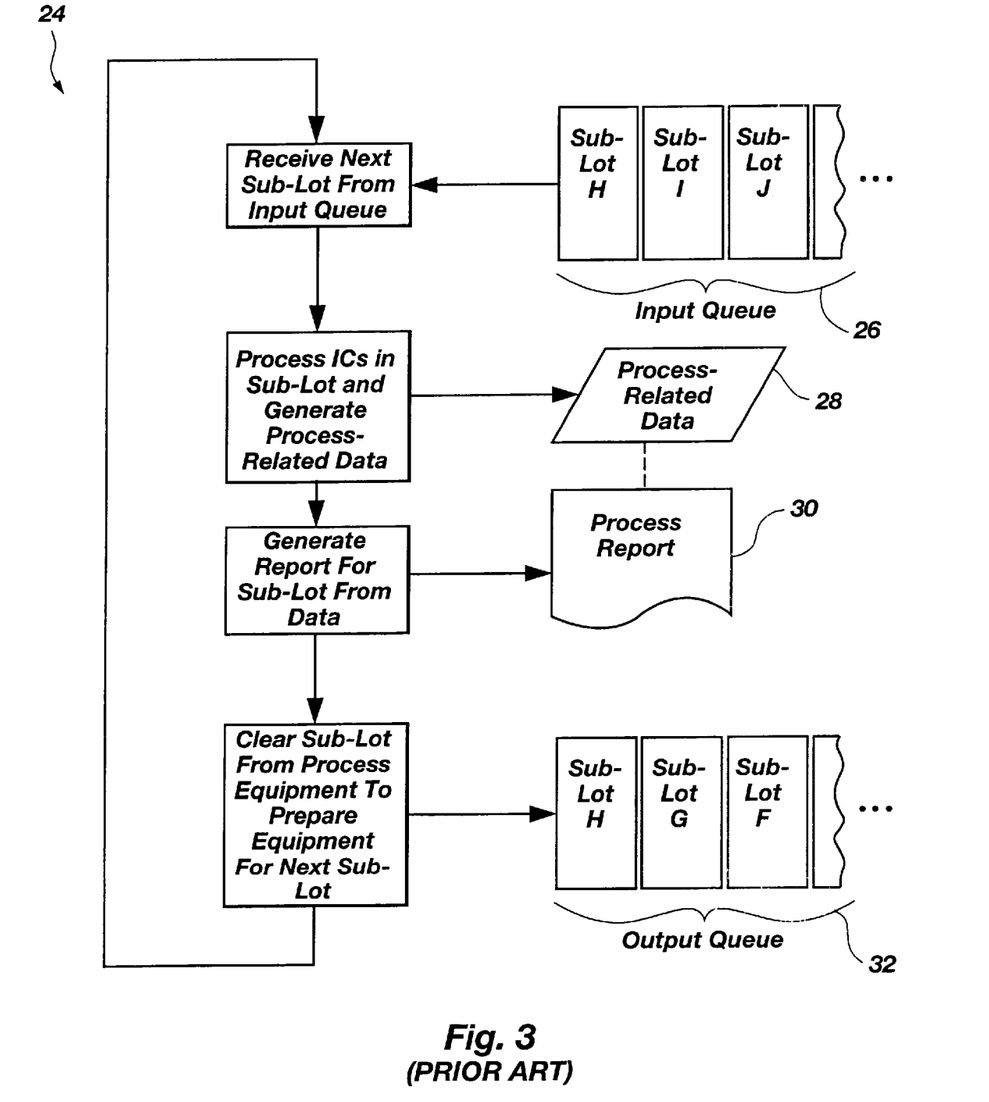
FIG. 3 is a flow diagram illustrating some of the inefficiencies of the conventional lot-based process of FIG. 1.

Unfortunately, the conventional lot-based tracking procedure described above is not as efficient as desired, as is illustrated by FIG. 3. In a typical assembly step 24, a sub-lot (e.g, sub-lot H) is received from an input queue 26 where sub-lots wait to proceed through the assembly step 24. The assembly step 24 may be any step in the IC assembly process of FIG. 1, including, for example, wafer saw, die attach, die cure, wire bond, molding, de-flash, lead finish, trim and form, and opens/shorts testing.

As a sub-lot advances through the assembly step 24, data 28 related to the assembly step 24 is generated. Such data 28 may include, for example: an identification of the processing equipment and the operating personnel for the assembly step 24; information regarding the set-up of the assembly step 24; and the time and date the sub-lot advanced through the assembly step 24.

Once a sub-lot has advanced through the assembly step 24, a process report 30 is manually or automatically generated based on the generated data 28. To associate the process report 30, and hence the data 28, with the ICs in the sub-lot, and thus track the ICs through the assembly step 24, the process report 30 lists the lot number (e.g., "H") of the ICs in the sub-lot. Typically, the process report 30 (often referred to as a "lot traveler") also physically accompanies the sub-lot through the remainder of the manufacturing process to ensure that the data 28 is correlated with the ICs in the sub-lot.

With the process report 30 generated, a processed sub-lot (e.g, sub-lot H) is cleared from equipment associated with the assembly step 24 to an output queue 32 to prepare the assembly step 24 for processing the next sub-lot (e.g, sub-lot 1). Once the processed sub-lot is cleared, the next sub-lot can be processed. This "clearing" process is necessary because if two sub-lots (e.g., sub-lots H and I) proceed through the assembly step 24 in a continuous manner, the conventional lot-based tracking procedure described above is unable to correlate the data 28 and the process report 30 generated as each of the two sub-lots proceeds with the correct sub-lot Instead, the data 28 for the two sub-lots is mixed, causing the conventional tracking procedure to fail to uniquely track the two sub-lots through the assembly step 24.

Thus, the described conventional lot-based tracking procedure is inefficient because it makes inefficient use of often very expensive manufacturing equipment and other resources by leaving sub-lots "parked" in input queues while process reports are generated and the equipment is cleared of already processed sub-lots. In assembly steps which use multiple machines in parallel to process a sub-lot (e.g., wire bond), some machines may be idle while other machines finish their allotment from the sub-lot being processed and the next sub-lot waits in an input queue. In addition, generation of the process reports, as well as clearing a processed sub-lot from equipment, often requires laborious manual work by operating personnel. Also, the conventional tracking procedure is not as reliable as desired, because the process reports that must physically accompany sub-lots through the manufacturing process can be lost or damaged.

As described in U.S. Pat. No. 's 5,301,143, 5,294,812, and 5,103,166, some non-lot based methods have been devised to aid quality control personnel in tracking ICs undergoing failure analysis back to the wafer from which they come. By tracking the ICs back to their wafer, test data related to the ICs can be correlated to the wafer to pinpoint possible problems with the wafer. Such methods take place off the manufacturing line, and involve the use of electrically retrievable identification (ID) codes, such as so-called "fuse ID's," programmed into individual ICs to identify the ICs. Fuse ID's and other electrically retrievable ID codes are typically programmed into ICs by blowing selected fuses or anti-fuses in circuitry on the ICs so that the circuitry outputs the ID code when accessed. Unfortunately, none of these methods addresses the inefficiency and reliability problems associated with the conventional lot-based tracking procedure described above.

Therefore, there is a need in the art for a non-lot based procedure for tracking ICs through an IC assembly process that uses manufacturing resources more efficiently. Such a procedure should not leave equipment idle while ICs wait to be processed. In addition, such a procedure should achieve a level of reliability not reached by conventional tracking procedures.

SUMMARY OF THE INVENTION

A tracking method in accordance with the invention tracks integrated circuit (IC) devices through the assembly steps in an IC device manufacturing process. The method is applicable to a variety of IC devices including, for example, lead frame devices, Chip-on-Board (COB) devices, flip-chip devices, Single In-Line Memory Modules (SIMMs), Dual In-Line Memory Modules (DIMMs), and Multi-Chip Modules (MCMs). Each of the IC devices includes a mounting substrate, such as a lead frame or a printed circuit (PC) board, on which a substantially unique mounting substrate identification (ID) code is marked. This ID code may be, for example, a bar code, an Optical Character Recognition (OCR) code, or, preferably, a coded hole matrix laser scribed into the substrate. In the inventive method, the ID codes of the IC devices are read using, for example, a bar code reader, OCR reader, or optical hole reader, and the IC devices are advanced through at least one of the assembly steps in the manufacturing process in a substantially continuous manner (i.e., without a break between lots). While the IC devices advance, they generate data related to the assembly step, such as data identifying particular equipment used during the step and the time and date each device advanced through the step. This data is then associated with the ID code of each of the IC devices to which it pertains (preferably by storing the data in a computer memory system) so the progress of individual devices can be tracked through the manufacturing process.

Because the invention provides for the tracking of individual IC devices during assembly, it allows the processing of IC devices without regard to lots, and thus substantially eliminates the inefficiencies associated with the conventional lot-based tracking methods previously described. Also, the invention provides a more reliable tracking method because it eliminates the need for lot travelers to accompany IC devices through the manufacturing process.

Tracking continuity between fabrication, probe, assembly, and back-end testing can be maintained in a number of ways. For example, at die attach (an assembly step), the mounting substrate ID codes of the IC devices can be stored in association with lot numbers, wafer numbers, or fuse IDs used during fabrication and probe. Also, at opens/shorts testing (another assembly step), for example, lot numbers can be assigned to groups of the IC devices, or fuse IDs of individual devices can be stored in association with the mounting substrate ID codes of the devices.

In another embodiment of the invention, a locating method can locate an individual IC device on a manufacturing line. In the method, mounting substrates of each of the IC devices are each marked with a substantially unique, optically-readable mounting substrate ID code. Then, when one of the devices is processed on an assembly machine, the ID code of the device is read and stored in association with a machine ID code of the machine. Also, when one of the devices is stored in an IC device carrier, such as a magazine, the ID code of the device is read and stored in association with a carrier ID number of the carrier. The carrier ID numbers of carriers storing IC devices are then read and stored in association with a location code indenting the location of the carriers on the manufacturing line. This location code may specify, for example, that a carrier is mounted to feed IC devices to a particular machine, mounted to receive processed IC devices from a particular machine, or stored in a particular storage location, such as a shelf or bin. Then, in order to locate an individual IC device on the manufacturing line, it is a simple matter of accessing the mounting substrate ID code of the device to be located and tracking the device to a particular machine, or to a particular carrier mounted on a machine or stored in a storage location.

DETAILED DESCRIPTION OF THE INVENTION

Some general concepts of the invention will be described with reference to FIG. 4 to aid in understanding the invention. This description of general concepts will be followed by a detailed description of the illustrated embodiments of the invention, with reference made to FIGS. 5A, 5B, and 6.

Figure 4:
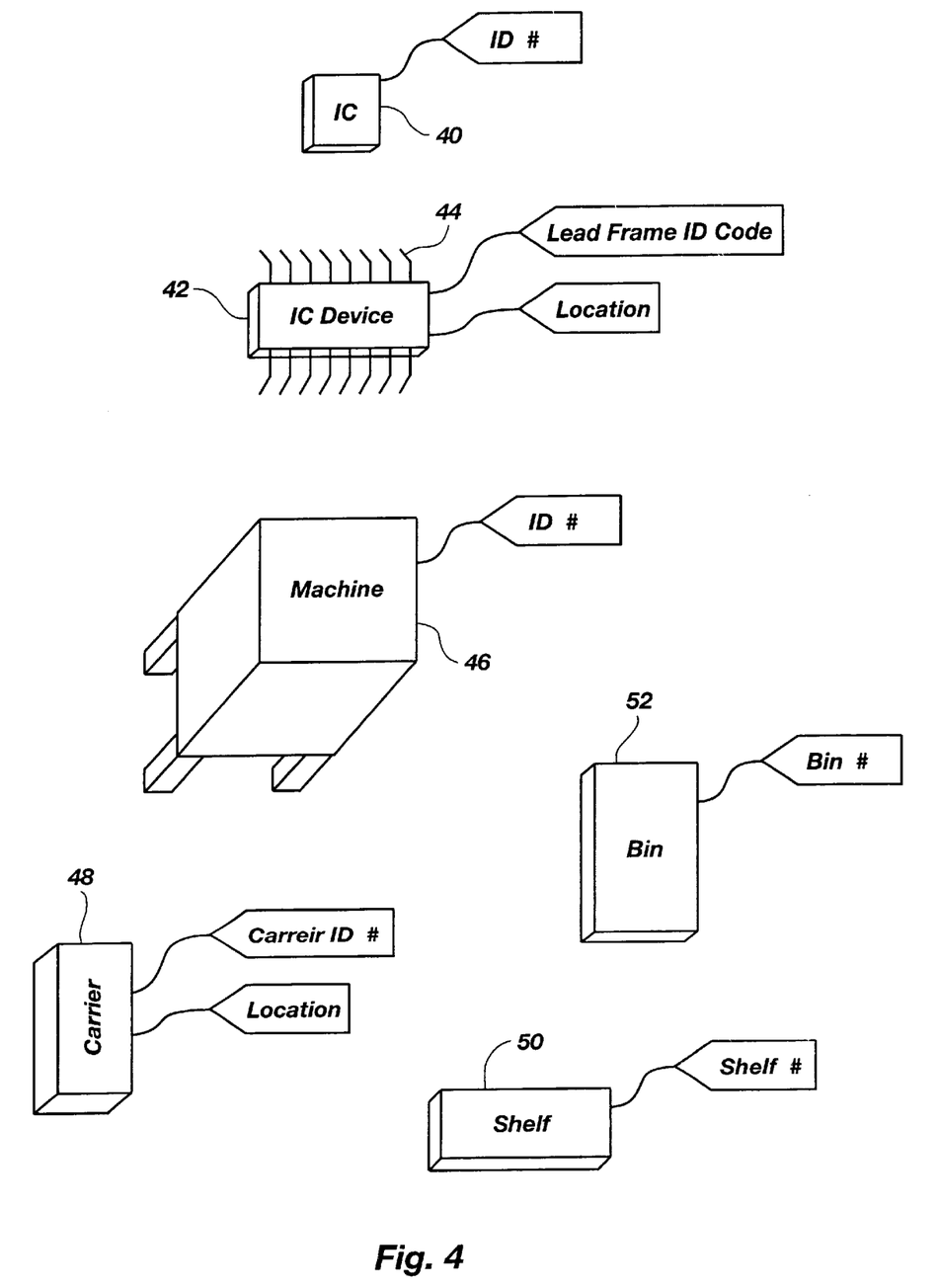
FIG. 4 is a diagram illustrating an IC, an IC device, an assembly machine, an IC device carrier, a shelf, and a bin having identification (ID) codes and location codes associated therewith in accordance with the invention.

As shown in FIG. 4, in an integrated circuit (IC) device manufacturing process conducted in accordance with a preferred embodiment of the invention, an IC 40 has at least one identification (ID) number, such as a lot number, a wafer number, or a fuse ID code, during fabrication and probe. This ID number allows the IC 40 to be tracked through fabrication and probe.

During assembly, the IC 40 is assembled into an IC device 42 that includes a lead frame 44, laser scribed with a coded hole matrix, that gives the IC device 42 a substantially unique, optically readable lead frame ID code. This lead frame ID code allows the IC device 42 to be individually tracked through assembly. In order to provide tracking continuity from fabrication through assembly, at die attach, the lead frame ID code is stored in a computer system (not shown) in association with the ID number of the IC 40. As a result, the IC device 42, and the IC 40 from which it is formed, can be tracked from fabrication through assembly by referring to the unique lead frame ID code of the IC device 42. To provide tracking continuity from assembly into back-end testing, the lead frame ID code of the IC device 42 can be correlated at the opens/shorts testing step to a fuse ID code of the IC device 42 used during back-end testing, for example, or IC devices coming out of assembly can be bundled into lots for processing by lot during back-end testing. Of course, back-end ID codes other than fuse ID codes and lot numbers can be used in association with the invention.

So that the IC device 42 may be individually located within assembly, the machines 46 that assemble the IC device 42, the IC device carriers 48 that store the device 42, and the shelves 50 or bins 52 that store the carriers 48 each have a unique ID number. In addition, the carriers 48 and the IC device 42 each have a location code that identifies their respective locations. The location code of the IC device 42 may, for example, indicate that the IC device 42 is located in a particular carrier 48, or that the IC device 42 is being processed on a particular machine 46. Similarly, the location code of the carrier 48 may, for example, indicate that the carrier 48 is mounted at the input to a particular machine 46, mounted at the output of the machine 46, or stored on a particular shelf 50 or in a particular bin 52. By constantly updating these location codes during assembly, the IC device 42 can be located at any time within assembly by referring to the lead frame ID code of the IC device 42, which points the way to the machine 46, shelf 50, or bin 52 at which the IC device 42 is located.

Figure 5A:
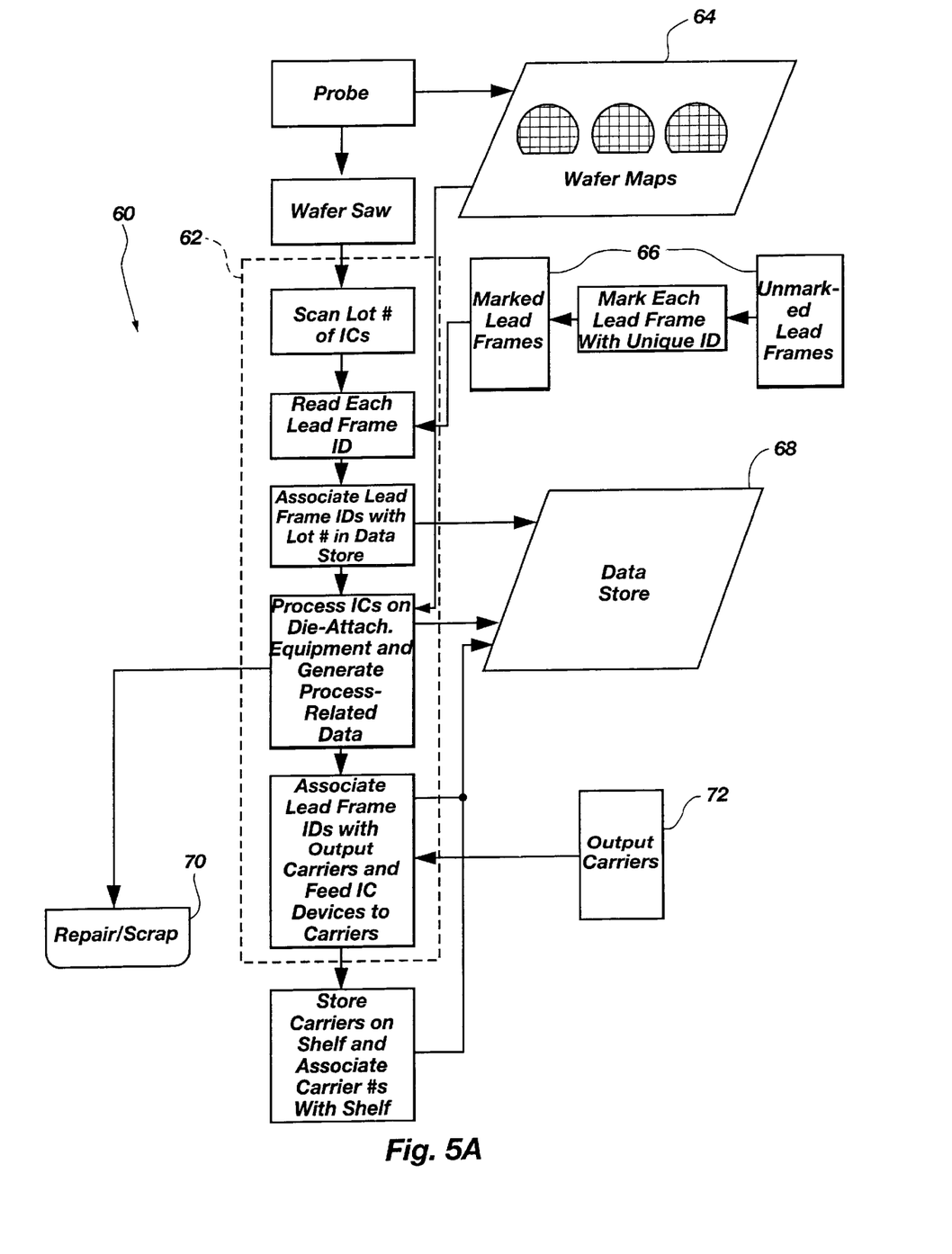
FIGS. 5A and 5B are flow diagrams of a method for assembling IC devices in accordance with the invention.

As shown in FIG. 5A, an inventive method 60 for tracking IC devices through assembly begins at the die attach step 62 after the probe step has generated wafer maps 64, as previously described, and the wafers (not shown) have been diced at the wafer saw step. It should be understood by those having skill in the field of this invention that the invention is applicable to any IC devices, including, for example, Dynamic Random Access Memories (DRAMs), Static RAMs (SRAMs), Synchronous DRAMs (SDRAMs), processors, Application Specific ICs (ASICs), Read Only Memories (ROMs), Electrically Erasable Programmable ROMs (EEPROMs), flip-chip IC devices, Chip-on-Board (COB) IC devices, lead frame IC devices, Single In-Line Memory Modules (SIMMs, Dual In-Line Memory Modules (DIMMs), and Multi-Chip Modules (MCMs). Also, although the invention will be described with respect to ICs fabricated on semiconductor wafers, it should be understood that the invention is also applicable to ICs fabricated using other technologies, such as Silicon-on-Sapphire (SOS), Silicon-on-Insulator (SOI), and Silicon-on-Glass (SOG). Further, it should be understood that the inventive method 60 may begin tracking IC devices at a step within assembly that is later than the die attach step 62, but that the die attach step 62 is a convenient step in which to begin such tracking.

The ICs (not shown) are provided to the die attach step 62 from the wafer saw step in lots identified by lot numbers. In accordance with the invention, at the die attach step 62, the lot numbers of the lots are scanned using a bar code scanner. Of course, other means may also be used to retrieve the lot numbers. Also, it should be understood that the invention is not limited to working with ICs initially identified by lot numbers but, rather, works equally well with ICs initially identified by any front-end ID code, including, for example, a wafer ID number or a fuse ID code.

Lead frames 66 used during assembly are each marked in accordance with the invention with a substantially unique lead frame ID code. Preferably, this "marking" process is performed by a laser scribe that produces a coded hole matrix in the rail of each of the lead frames 66, which provides a lead frame ID code that should be readable throughout the various steps of assembly. Of course, other methods may be used for marking, including the use of bar codes or Optical Character Recognition (OCR) codes. Also, although the invention will be described with respect to lead frames, it should be understood that the invention is equally applicable to IC devices manufactured on mounting substrates other than lead frames, such as printed circuit (PC) boards, where bar codes or OCR codes may be more suitable. Further, it should be understood that, as used to describe the lead frame ID codes, "substantially unique" means sufficiently unique for each of the codes to be unique amongst those IC devices currently being manufactured. Thus, for example, in some instances, a lead frame ID code of a previously manufactured IC device might be used again at a later date with an IC device then being manufactured.

With the lead frames 66 each marked with a lead frame ID code, the lead frames 66 are fed into the die attach step 62 and the lead frame ID code of each lead frame 66 is read using an optical hole reader (not shown). Of course, when the ID code is a bar or OCR code, a bar code reader or OCR reader will be used to read the ID codes of the lead frames 66 instead. A conventional Cycle Redundancy Check (CRC) may be used during reading to enhance the accuracy of the reading.

Once the lead frame ID codes are read, the ICs are each attached to one of the lead frames 66 and the lot number of each of the ICs is stored in a data store 68 in association with the lead frame ID code of the lead frame 66 to which each IC is attached. Data related to the die attach step 62, such as a machine ID number of equipment used during the step 62 and the date and time of processing through the step 62, is also stored in the data store 68 in association with the lead frame ID codes. Of course, at the die attach step 62, any ICs identified by the wafer maps 64 as being bad are diverted to repair/scrap 70. Also, as previously described with respect to FIG. 4, the IC devices each have an associated location code. Thus, during the die attach step 62, the location codes of the IC devices are stored in the data store 68 in association with the lead frame ID codes of the devices, and the location codes identify the location of the devices as being in-process on the die attach equipment (not shown).

Preferably, the data store 68 employs local data distribution and buffering techniques so that a failure of a central portion of the computer system (not shown) does not impact the local storage and use of data in the data store 68 along the manufacturing line.

Once the ICs are attached to the lead frames 66, the resulting IC devices are output from the die attach equipment and stored in carriers 72, such as IC device magazines or tubes. As described previously with respect to FIG. 4, the carriers 72 each have an associated carrier ID number (e.g., a bar code) and location code stored in the data store 68. Because the carriers 72 are mounted at the output of the die attach equipment, the location codes of the carriers 72 indicate this. At the same time, as the IC devices exit the die attach equipment, the location codes of the devices are updated in the data store 68 to indicate that the IC devices are located in particular carriers 72. If the IC devices have to be stored before proceeding to the next step in assembly, the carriers 72 are stored on a shelf (not shown) or in a bin (not shown), and the location codes of the carriers 72 are updated in the date store 68 to indicate their location at a particular shelf having a shelf ID number or in a particular bin having a bin ID number.

Figure 5B:
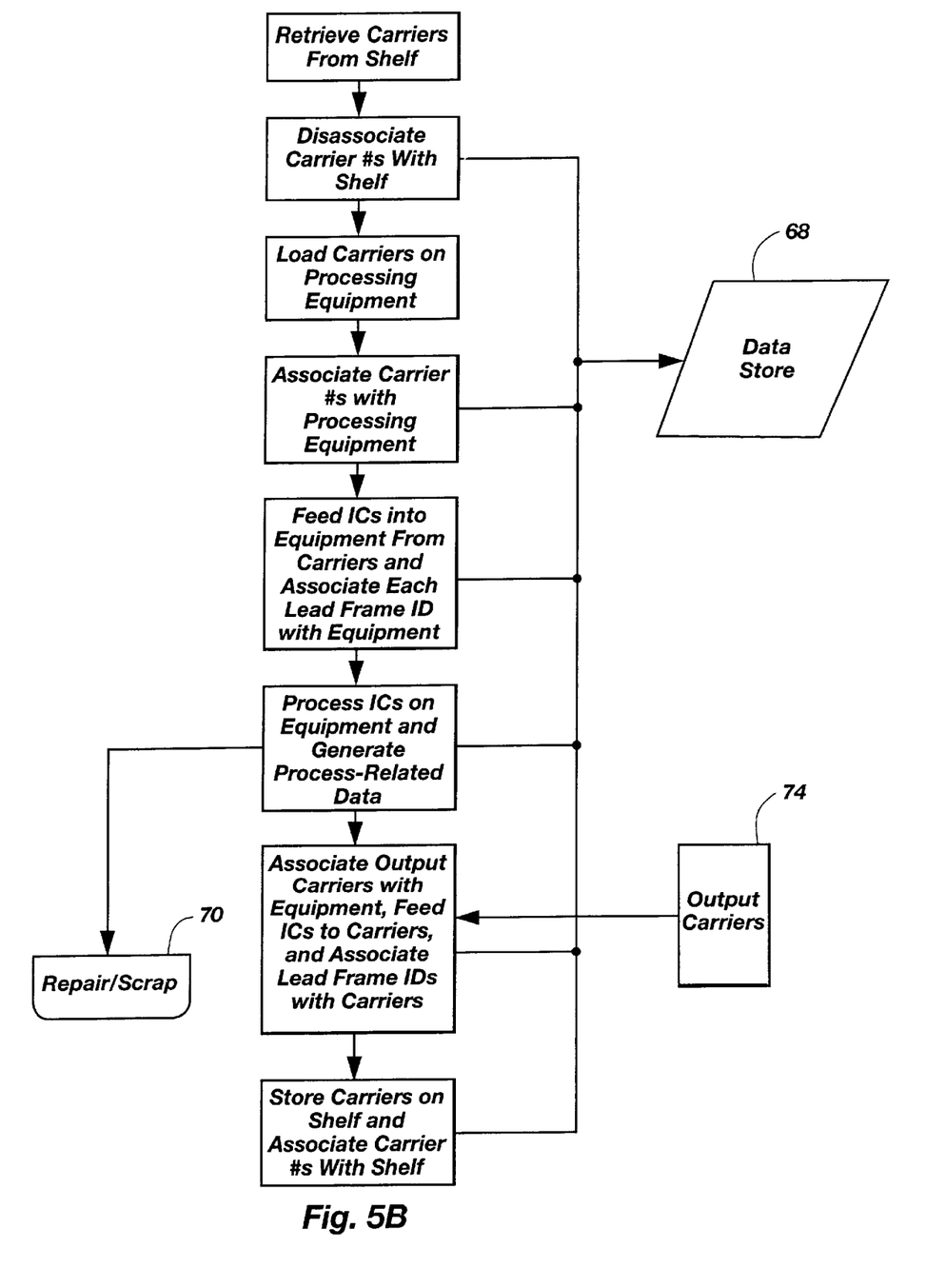

As shown in FIG. 5B, when the carriers 72 (FIG. 5A) are ready to be processed at another step within assembly, such as die cure, wire bond, molding, de-flash, lead finish, trim and form, or opens/shorts testing, an operator retrieves the carriers 72 from their storage location, at which point the carriers 72 are disassociated in the data store 68 with the storage location. Of course, if the carriers 72 proceed in a continuous manner between assembly steps, then the operator would retrieve the carriers 72 from the previous step rather than from a storage location.

Once retrieved, the carriers 72 are loaded on the processing equipment of the next assembly step, and the location codes of the carriers 72 are updated in the data store 68 to indicate the new location of the carriers 72. The IC devices are then fed into the equipment from the carriers 72, the lead frame ID codes of the devices are read using an optical hole reader mounted on the equipment, and the location codes of the devices are updated in the data store 68 to indicate they are in-process on the equipment. The devices are then checked to verify they are supposed to be processed in the assembly step. If any of the devices are found to be at the equipment in error, or are found to be scrap, the devices are diverted to repair/scrap 70. Otherwise, the devices are processed on the equipment and process-related data, such as time and date of processing, is generated and stored in the data store 68 in association with the previously read lead frame ID codes of the devices. The devices are then fed out of the equipment into new carriers 74, with the location codes of the carriers 74 being updated in the data store 68 to indicate the carriers 74 are mounted at the output of the equipment, and the location codes of the IC devices being updated in the data store 68 to indicate their location in particular carriers 74. If the carriers 74 are to be stored prior to being processed at the next assembly step, the carriers 74 are stored on a shelf or in a bin in a manner similar to that described above with respect to FIG. 5A.

Figure 6:
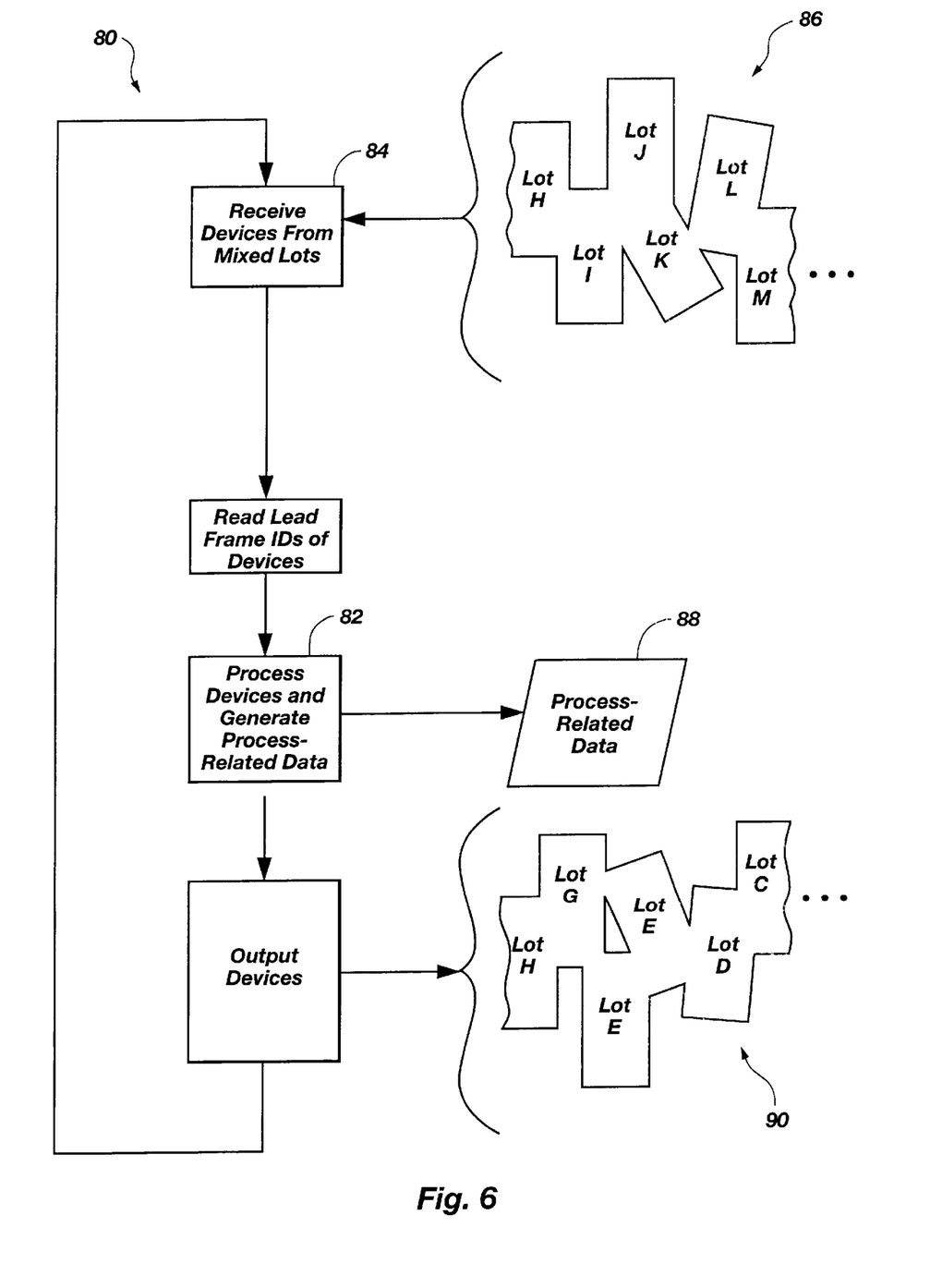
FIG. 6 is a flow diagram illustrating processing efficiencies gained by using the inventive method of FIGS. 5A and 5B.

As described, the invention provides superior tracking and efficiency, as is illustrated by FIG. 6. As shown therein, a method 80 for tracking IC devices through an assembly step 82 in an IC manufacturing process in accordance with the invention includes a step 84 of receiving IC devices from multiple, mixed lots 86. It will be understood by those having skill in the field of this invention that the assembly step 82 may encompass processing by a single machine, part of a machine, many machines operating in series or parallel, or any combination thereof. In addition, it will be understood that the step 84 of receiving IC devices from multiple, mixed lots 86 is without regard to the lots from which the IC devices come, and thus allows a more efficient use of processing equipment than traditional lot-based procedures. It will also be understood, of course, that although the invention is described as being implemented in a single assembly step 82 for ease of understanding, the invention more typically is implemented in a series of assembly steps.

Before or after the IC devices progress through the assembly step 82, their lead frame ID codes are read and stored in a data store 88. As the IC devices progress through the assembly step 82, data related to the assembly step 82 is generated for each IC device. Such data may include, for example, the processing equipment used, the operating personnel present, the set-up, and the time and date of processing for the assembly step 82. The set-up for the assembly step 82 may include, for example, a standard set-up or a set-up in accordance with a Special Work Request (SWR) or a "hot" lot.

Once the IC devices have advanced through the assembly step 82, the processed IC devices are output from the assembly step 82 to mixed output lots 90. It should be understood that, in some cases, the processed IC devices must be cleared from assembly equipment before other IC devices can be processed, and in other cases, such as in serial-feed machines, processed IC devices are being output from the assembly step 82 while other IC devices are advancing through the assembly step 82 and still other IC devices are being received by the assembly step 82. Any of these cases fall within the scope of the invention.

It should be understood that by reading the lead frame ID codes of processed IC devices and associating those codes with data generated during processing, the inventive method 80 avoids the need for lot-based manufacturing altogether. The input and output lots 86 and 90 may then be mixed without regard to lots, and the processing of IC devices through the assembly step 82 may proceed in a substantially continuous fashion, thus dramatically improving the utilization of processing equipment. In addition, because the lead frame ID codes and associated data read and generated using the inventive method need not physically accompany ICs as they progress through the manufacturing process, the inventive method is more reliable than conventional tracking procedures (i.e., it eliminates the need for lot travelers).

Although the present invention has been described with reference to particular embodiments, the invention is not limited to these described embodiments. Rather, the invention is limited only by the appended claims, which include within their scope all equivalent methods that operate according to the principles of the invention as described.

What is claimed is:

1. A method for tracking multiple lots of a plurality of integrated circuit devices through an assembly step in an integrated circuit manufacturing process, each integrated circuit device of the plurality of integrated circuit devices having a mounting substrate, the method comprising:

providing a mounting substrate;

providing a plurality of integrated circuit devices;

placing a substantially unique identification code on the mounting substrate in a readable position thereon;

placing an identification code on the each integrated circuit device of the plurality of integrated circuit devices;

associating the identification code of the integrated circuit device with a substrate code:

mounting at least one of the plurality of integrated circuit devices on the mounting substrate;

reading the mounting substrate identification code of the each integrated circuit device of the plurality of integrated circuit devices in each lot of the multiple lots;

advancing the plurality of integrated circuit devices in the multiple lots through a series of assembly steps in the manufacturing process in a substantially continuous manner;

generating data related to the advancement of the each integrated circuit devices of the plurality of integrated circuit devices through the assembly step; and associating the data generated for the each integrated circuit device of the plurality of integrated circuit devices with the mounting substrate identification code of its associated integrated circuit device so the multiple lots of the plurality of integrated circuit devices may be tracked through the assembly step.

2. The method of claim 1, wherein the each integrated circuit device of the plurality of integrated circuit devices includes a mounting substrate selected from a group comprising a lead frame and a printed circuit board, wherein the each integrated circuit device of the plurality of integrated circuit devices is selected from a group comprising lead frame integrated circuit devices, Chip-on-Board (COB) integrated circuit devices, and flip-chip integrated circuit devices.

3. The method of claim 1, wherein the mounting substrate of the each integrated circuit device of the plurality of integrated circuit devices is marked with a unique, optically retrievable mounting substrate identification code, wherein the step of reading the mounting substrate identification code of the each integrated circuit device of the plurality of integrated circuit devices comprises optically retrieving the mounting substrate identification code of the each integrated circuit device of the plurality of integrated circuit devices.

4. The method of claim 3, wherein the unique, optically retrievable mounting substrate identification code comprises one of a bar code, an Optical Character Recognition (OCR) code, and a coded hole matrix and wherein the assembly step of optically retrieving the mounting substrate identification code of the each integrated circuit device of the plurality of integrated circuit devices comprises retrieving the code of the each integrated circuit device of the plurality of integrated circuit devices with one of a bar code reader, an OCR reader, and an optical hole reader.

5. The method of claim 1, wherein the assembly step of a series of assembly steps in the integrated circuit device manufacturing process includes one assembly step of die attach, die cure, wire bond, molding, de-flash, lead finish, trim and form, and opens/shorts testing.

6. The method of claim 1, wherein the reading the mounting substrate identification code of the each integrated circuit device of the plurality of integrated circuit devices occurs before the advancing the plurality of integrated circuit devices through the assembly step in the integrated circuit manufacturing process.

7. The method of claim 1, wherein the advancing the plurality of integrated circuit devices through a series of assembly steps in the manufacturing process comprises advancing the plurality of integrated circuit devices serially through multiple machines associated with the series of assembly steps.

8. The method of claim 1, wherein the advancing the plurality of integrated circuit devices through a series of assembly steps in the integrated circuit manufacturing process comprises advancing the plurality of integrated circuit devices through parallel machines associated with the series of assembly steps.

9. The method of claim 1, wherein the generating data related to the advancement of the each integrated circuit device of the plurality of integrated circuit devices through the assembly step comprises generating at least one of assembly equipment data, assembly personnel data, assembly set-up data, and time and date data.

10. The method of claim 1, further comprising the storing the mounting substrate identification code of the each integrated circuit device of the plurality of integrated circuit devices after it is read and wherein the associating the data generated for the each integrated circuit device of the plurality of integrated circuit devices with the mounting substrate identification code of its associated integrated circuit device comprises storing the data generated for the each integrated circuit device of the plurality of integrated circuit devices in association with the stored mounting substrate identification code of its associated integrated circuit device.

11. The method of claim 10, wherein the storing the data generated for the each integrated circuit device of the plurality of integrated circuit devices in association with the stored mounting substrate identification code of its associated integrated circuit device comprises storing the data in a decentralized manner within a computer system so at least partial access to the stored data may continue during a failure of a centralized portion of the computer system.

12. A method of manufacturing a plurality of integrated circuit devices, the method comprising:

provoiding a plurality of fabrication substrates in multiple lots;

fabricating a plurality of integrated circuit dice on each of the fabrication substrate of the plurality of fabrication substrates;

separating each integrated circuit die of the plurality of integrated circuit dice on each fabrication substrate of the plurality of fabrication substrates from its fabrication substrate to form one integrated circuit die of a plurality of integrated circuit dice;

providing a plurality of mounting substrates, each mounting substrate of the plurality of mounting substrates marked with a substantially unique mounting substrate identification code;

providing a front-end identification code associated with each substantially unique mounting substrate identification code associated with the each integrated circuit die of the plurality of integrated circuit dice;

reading a front-end identification code associated with the each integrated circuit die of the plurality of integrated circuit dice;

reading the substantially unique mounting substrate identification code marked on the each mounting substrate of the plurality of mounting substrates;

attaching the each integrated circuit die of the plurality of integrated circuit dice to one mounting substrate of the plurality of mounting substrates to form one integrated circuit device of a plurality of integrated circuit devices;

storing the front-end identification code of the each integrated circuit die of the plurality of integrated circuit dice in each integrated circuit device of the plurality of integrated circuit devices in association with the substantially unique mounting substrate identification code of the each mounting substrate of the plurality of mounting substrates to which the each integrated circuit die of the plurality of integrated circuit dice is attached;

advancing the each integrated circuit device of the plurality of integrated circuit devices through assembly including:

advancing the plurality of integrated circuit devices through at least one assembly step in a substantially continuous manner;

generating data related to the advancement of the each integrated circuit device of the plurality of integrated circuit devices through the assembly step; and associating the data generated for the each integrated circuit device of the plurality of integrated circuit devices with the substantially unique mounting substrate identification code of the each mounting substrate of the plurality of mounting substrates of the each integrated circuit device of the plurality of integrated circuit devices so the plurality of integrated circuit devices may be tracked through the assembly step; and back-end testing the each integrated circuit device of the plurality of integrated circuit devices.

13. The method of claim 12, further comprising:

storing a back-end identification code of the each integrated circuit device of the plurality of integrated circuit devices in association with the substantially unique mounting substrate identification code of the each mounting substrate of the plurality of mounting substrates to which the each integrated circuit die of the plurality of integrated circuit dice is attached; and storing back-end testing-related data for the each integrated circuit device of the plurality of integrated circuit devices in association with the back-end identification code of the each integrated circuit device of the plurality of integrated circuit devices so the plurality of integrated circuit devices may be tracked through back-end testing.

14. The method of claim 13, wherein the step of storing a back-end identification code of the each integrated circuit device of the plurality of integrated circuit devices comprises storing at least one of a fuse ID code and a lot number.

15. The method of claim 13, wherein the front-end identification code and back-end identification code associated with the each integrated circuit device of the plurality of integrated circuit devices are identical.

16. The method of claim 12, wherein the providing the plurality of fabrication substrates comprises providing substrates selected from a group comprising semiconductor wafers, Silicon-on-Sapphire (SOS) substrates, Silicon-on-Insulator (SOI) substrates, and Silicon-on-Glass (SOG) substrates.

17. The method of claim 12, wherein the fabricating a plurality of integrated circuit dice on the each fabrication substrate of the plurality of fabrication substrates comprises fabricating integrated circuit dice selected from a group comprising Dynamic Random Access Memory (DRAM) ICs, Static Random Access Memory (SRAM) ICs, Synchronous DRAM (SDRAM) ICs, processor ICs, Application Specific ICs (ASICs), Read Only Memory (ROM) ICs, and Electrically Erasable Programmable ROM (EEPROM) ICs.

18. The method of claim 12, further comprising the programming the each integrated circuit die of the plurality of integrated circuit dice on the each of the fabrication substrate of the plurality of fabrication substrates to permanently store a substantially unique fuse ID code, wherein the reading a front-end identification code associated with the each integrated circuit die of the plurality of integrated circuit dice comprises reading a fuse ID code programmed into the each integrated circuit die of of the plurality of integrated circuit dice.

19. The method of claim 18, wherein the programming the each integrated circuit die of the plurality of integrated circuit dice on the each fabrication substrate of the plurality of fabrication substrates to permanently store a substantially unique fuse ID code comprises programming at least one of fuses and anti-fuses in the each integrated circuit die of the plurality of integrated circuit dice on the each fabrication substrate of the plurality of fabrication substrates to permanently store each substantially unique fuse ID.

20. The method of claim 12, wherein the providing the plurality of mounting substrates comprises marking the each mounting substrate of the plurality of mounting substrates with an optically readable, substantially unique mounting substrate ID code selected from a group comprising a bar code, an Optical Character Recognition (OCR) code, and a coded hole matrix.

21. The method of claim 20, wherein the each mounting substrate of the plurality of mounting substrates comprises one of a plurality of lead frames, wherein the marking the each mounting substrate of the plurality of mounting substrates comprises laser scribing a coded hole matrix in a lead frame rail of each lead frame of the plurality of lead frames.

22. The method of claim 12, wherein the reading a front-end identification code associated with the each integrated circuit die of the plurality of integrated circuit dice comprises reading at least one of a lot number, a wafer number, and a fuse ID code associated with the each integrated circuit die of the plurality of integrated circuit dice.

23. The method of claim 12, wherein the reading the substantially unique mounting substrate identification code marked on the each mounting substrate of the plurality of mounting substrates comprises reading the substantially unique mounting substrate identification codes with at least one of a bar code reader, an Optical Character Recognition (OCR) reader, and an optical hole reader.

24. The method of claim 12, wherein the reading the substantially unique mounting substrate identification code includes verifing the substantially unique mounting substrate identification code using a Cycle Redundancy Check (CRC).

25. The method of claim 12, wherein the providing the plurality of mounting substrates comprises providing at least one of a plurality of lead frames and a plurality of printed circuit boards.

26. The method of claim 12, further comprising the verifying that the plurality of integrated circuit devices are supposed to progress through the assembly before advancing the plurality of integrated circuit devices through the assembly.

27. The method of claim 12, wherein the attaching the plurality of integrated circuit dice comprises attaching the plurality of integrated circuit dice using at least one of a Chip-on-Board (COB) technique and a flip-chip technique.

28. A method of manufacturing multi-chip integrated circuit devices, the method comprising:
    providing a plurality of fabrication substrates in multiple lots;
    fabricating a plurality of integrated circuit dice on each fabrication substrate of the plurality of fabrication substrates;
    separating each integrated circuit die of the plurality of integrated circuit dice on the each fabrication substrate of the plurality of fabrication substrates from its fabrication substrate to form one integrated circuit die of a plurality of integrated circuit dice;
    providing a plurality of mounting substrates, each mounting substrate marked with a substantially unique mounting substrate identification code;
    providing a front-end identification code associated with each substantially unique mounting substrate identification code associated with the each integrated circuit die of the plurality of integrated circuit dice;
    reading a front-end identification code associated with the each integrated circuit die of the plurality of integrated circuit dice;
    reading a mounting substrate identification code marked on the each mounting substrate of the plurality of mounting substrates;
    attaching more than one integrated circuit die of the plurality of integrated circuit dice to the each mounting substrate of the plurality of mounting substrates to form a plurality of multi-chip integrated circuit devices;
    storing the front-end identification code of the each integrated circuit die of the plurality of integrated circuit dice in each multi-chip integrated circuit device of the plurality of multi-chip integrated circuit devices in association with the substantially unique mounting substrate identification code of the each mounting substrate of the plurality of mounting substrates to which the each integrated circuit die of the plurality of integrated circuit dice is attached;
    advancing the each multi-chip integrated circuit device of the plurality of multi-chip integrated circuit devices through assembly including:
        advancing the plurality of multi-chip integrated circuit devices through at least one assembly step in a substantially continuous manner;
        generating data related to the advancement of the each multi-chip integrated circuit device of the plurality of multi-chip integrated circuit devices through the at least one assembly step; and
        associating the data generated for the each multi-chip integrated circuit device of the plurality of multi-chip integrated circuit devices with the substantially unique mounting substrate identification code of the each mounting substrate of plurality of mounting substrates the each multi-chip integrated circuit device of the plurality of multi-chip integrated circuit devices so the plurality of multi-chip integrated circuit devices may be tracked through the assembly step; and
    back-end testing the each multi-chip integrated circuit device of the plurality of multi-chip integrated circuit devices.

29. The method of claim 28, further comprising:
    storing a back-end identification code of the each integrated circuit die of the plurality of integrated circuit dice in the each multi-chip integrated circuit device of the plurality of multi-chip integrated circuit devices in association with the substantially unique mounting substrate identification code of the each mounting substrate of the plurality of mounting substrates to which the each integrated circuit die of the plurality of integrated circuit dice is attached; and
    storing back-end testing-related data for the each integrated circuit device of the plurality of integrated circuit devices in association with the back-end identification code of the each integrated circuit die of the plurality of integrated circuit dice so the plurality of integrated circuit dice may be tracked through back-end testing.

30. The method of claim 28, wherein the attaching more than one integrated circuit die of the plurality of integrated circuit dice to the each mounting substrate of the plurality of mounting substrates to form the plurality of multi-chip integrated circuit devices comprises attaching more than one integrated circuit die of the plurality of integrated circuit dice to the each mounting substrate of the plurality of mounting substrates to form a plurality of multi-chip integrated circuit devices selected from a group comprising Single In-Line Memory Modules (SIMMs), Dual In-Line Memory Modules (DIMMs), Multi-Chip Modules (MCMs), and multi-chip printed circuit (PC) boards.

31. A method of locating an individual integrated circuit die of a plurality integrated circuit device having at least one integrated circuit die on an integrated circuit device manufacturing line on which a multitude of integrated circuit devices are being manufactured, the method comprising:
    marking a mounting substrate of the at least one integrated circuit die of the plurality of integrated circuit devices with a substantially unique, optically-readable mounting substrate identification code;
    advancing the plurality of integrated circuit devices through assembly in multiple lots; and
    when one integrated circuit device of the plurality of integrated circuit devices is being processed by an assembly-related machine, reading the substantially unique, optically readable mounting substrate identification code associated with the at least one integrated circuit die of the integrated circuit device and storing the substantially unique, optically readable identification code in association with a machine identification number of the assembly-related machine;

when the one integrated circuit device of the plurality of integrated circuit devices is stored in an integrated circuit device carrier, reading the substantially unique, optically readable mounting substrate identification code associated with the at least one integrated circuit die of the integrated circuit device and storing the substantially unique, optically readable identification code in association with a carrier identification number of the integrated circuit device carrier;

reading the carrier identification numbers of the integrated circuit device carriers in which the integrated circuit devices are stored and storing the carrier identification numbers in association with a location code identifying a location of the integrated circuit device carriers on a manufacturing line; and when the individual integrated circuit device is stored in the integrated circuit device carrier, locating the individual integrated circuit device on the manufacturing line by accessing the carrier identification number stored in association with the substantially unique, optically readable mounting substrate identification code of the at least one integrated circuit die of the individual integrated circuit device and by accessing the location code stored in association with the accessed carrier identification number; and when the individual integrated circuit device is being processed by an assembly-related machine, locating the individual integrated circuit device on the manufacturing line by accessing a machine identification number stored in association with the substantially unique, optically readable mounting substrate identification code of the at least one integrated circuit die of the individual integrated circuit device.

32. The method of claim 31, wherein the reading the carrier identification numbers comprises reading carrier bar codes.

33. The method of claim 31, wherein the storing the carrier identification numbers in association with a location code identifying the location of the integrated circuit device carriers on the manufacturing line comprises storing the carrier identification numbers in association with a location code identifying the location of the integrated circuit device carriers as being a location selected from a group comprising on a storage shelf, in a storage bin, mounted to feed a plurality of integrated circuit devices into an assembly-related machine, and mounted to receive processed integrated circuit devices from an assembly-related machine.

* * * * *

UNITED STATES PATENT AND TRADEMARK OFFICE
CERTIFICATE OF CORRECTION

PATENT NO. : 6,226,394 B1
DATED : May 1, 2001
INVENTOR(S) : Wilson et al.

It is certified that error appears in the above-identified patent and that said Letters Patent is hereby corrected as shown below:

Title page,
Item [73], Assignee, change "Tecnology" to -- Technology --.

Drawings,
Fig. 1, in 8$^{th}$ box down through center of figure, change "Deflash" to -- De-flash --;
Fig. 2, in 3$^{rd}$ box down on left of figure, change "Carreirs" to -- Carriers --; and
Fig. 4, in tag extending from left of box "48", change "Carreir ID #" to -- Carrier ID # --.

Column 2,
Line 34, change "sublot" to -- sub-lot --;
Line 37, change "resplit" to -- re-split --;

Column 3,
Line 28, change "1)." to -- I). --;

Column 5,
Line 6, change "indenting" to -- identifying --;

Column 6,
Line 8, before "device 42" insert -- IC --;
Line 38, change "(SIMMs," to -- (SIMMs), --; and Column 7,
Line 59, change "date" to -- data --.

Column 9,
Line 38, change "code" to -- codes --;
Line 39, change "device" to -- devices to be mounted on the substrate --;
Line 50, change "devices" to -- device --;

Column 10,
Line 29, change "assembly step" to -- series of assembly steps --;
Line 49, after "comprising" delete "the";

UNITED STATES PATENT AND TRADEMARK OFFICE
CERTIFICATE OF CORRECTION

PATENT NO.    : 6,226,394 B1
DATED         : May 1, 2001
INVENTOR(S)   : Wilson et al.

It is certified that error appears in the above-identified patent and that said Letters Patent is hereby corrected as shown below:

Column 11,
Line 48, after "the" insert -- at least one --;
Line 57, before "assembly" insert -- at least one --;

Column 12,
Line 41, change "of of the" to -- of the --;

Column 13,
Line 21, after "comprising" delete "the";

Column 14,
Lines 16-18, after "substrates" delete the remainder of line 16, all of line 17, and "devices" at the beginning of line 18;
Line 19, after "the" insert -- at least one --;
Line 34, after "each" insert -- multi-chip --;
Line 35, before "integrated" insert -- multi-chip --;
Line 54, change "die" to -- device --; after "plurality" insert -- of -- and change "device" to -- devices --;

Column 15,
Line 4, after "readable" insert -- mounting substrate --; and
Line 13, after "readable" insert -- mounting substrate --.

Signed and Sealed this

First Day of October, 2002

*Attest:*

JAMES E. ROGAN
*Attesting Officer*     *Director of the United States Patent and Trademark Office*